(12) United States Patent
Lemberger et al.

(10) Patent No.: US 9,863,033 B2
(45) Date of Patent: Jan. 9, 2018

(54) METHOD FOR PRODUCING A COATING AND OPTOELECTRONIC SEMICONDUCTOR COMPONENT HAVING A COATING

(71) Applicant: OSRAM Opto Semiconductors GmbH, Regensburg (DE)

(72) Inventors: Martin Lemberger, Neunkirchen (DE); Michael Schmal, Schmidmuehlen (DE); Julian Ikonomov, Neutraubling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/318,330

(22) PCT Filed: Jun. 11, 2015

(86) PCT No.: PCT/EP2015/063089
§ 371 (c)(1),
(2) Date: Dec. 12, 2016

(87) PCT Pub. No.: WO2015/189344
PCT Pub. Date: Dec. 17, 2015

(65) Prior Publication Data
US 2017/0114444 A1    Apr. 27, 2017

(30) Foreign Application Priority Data
Jun. 13, 2014 (DE) .................. 10 2014 108 348

(51) Int. Cl.
*H01L 33/46* (2010.01)
*C23C 14/22* (2006.01)
(Continued)

(52) U.S. Cl.
CPC .......... *C23C 14/225* (2013.01); *C23C 14/505* (2013.01); *H01L 31/02327* (2013.01);
(Continued)

(58) Field of Classification Search
CPC ............. H01L 2933/0058; H01L 33/60; H01L 33/405; H01L 31/02168; H01L 33/46;
(Continued)

(56) References Cited

U.S. PATENT DOCUMENTS

| 4,010,710 A | 3/1977 | Williams |
| 2008/0241421 A1 | 10/2008 | Chen et al. |

(Continued)

FOREIGN PATENT DOCUMENTS

| DE | 4025659 A1 | 2/1992 |
| DE | 4312552 A1 | 10/1994 |
| JP | H09-256155 A | 9/1997 |

*Primary Examiner* — Jasmine Clark
(74) *Attorney, Agent, or Firm* — McDermott Will & Emery LLP

(57) ABSTRACT

What is specified is a method for producing a coating comprising the following steps: —providing a material source having a top surface and a main coating direction, —providing a substrate holder having a top surface, —providing at least one base layer, having a coating surface remote from the substrate holder, on the top surface of the substrate, —attaching the substrate holder to a rotating arm, which has a length along a main direction of extent of the rotating arm, —setting the length of the rotating arm in such a manner that a normal angle (φ) throughout the method is at least 30° and at most 75°, —applying at least one coating to that side of the base layer which has the coating surface by means of the material source, wherein—during the coating process with the coating, the substrate holder is rotated about a substrate axis of rotation running along the main direction of extent of the rotating arm.

18 Claims, 7 Drawing Sheets

(51) Int. Cl.
    *C23C 14/50*     (2006.01)
    *H01L 33/38*     (2010.01)
    *H01L 31/0232*     (2014.01)
    *H01L 31/0224*     (2006.01)
    *H01L 33/20*     (2010.01)
    *H01L 31/0352*     (2006.01)

(52) U.S. Cl.
    CPC ........ *H01L 31/022408* (2013.01); *H01L 31/035281* (2013.01); *H01L 33/20* (2013.01); *H01L 33/38* (2013.01); *H01L 33/46* (2013.01); *H01L 2933/0025* (2013.01)

(58) Field of Classification Search
    CPC ......... H01L 33/44; H01L 33/20; H01L 33/38; H01L 31/035281; H01L 33/54; H01L 2933/0025; C23C 14/3414; C23C 14/505; C23C 14/225
    See application file for complete search history.

(56) References Cited

U.S. PATENT DOCUMENTS

| | | | |
|---|---|---|---|
| 2008/0258270 A1* | 10/2008 | Bondoux | H01L 21/316 257/632 |
| 2011/0027459 A1 | 2/2011 | Lee et al. | |
| 2012/0080308 A1 | 4/2012 | Kameyama | |
| 2013/0092975 A1* | 4/2013 | Jain | B82Y 20/00 257/100 |
| 2014/0014497 A1 | 1/2014 | Druz et al. | |

\* cited by examiner

METHOD FOR PRODUCING A COATING AND OPTOELECTRONIC SEMICONDUCTOR COMPONENT HAVING A COATING

One object to be achieved is to provide a method for producing a conformably covering coating. Another object to be achieved is to provide an optoelectronic semiconductor component having a conformably covering coating.

What is specified is a method for producing a coating. The coating may be a metal layer, a semiconductor layer or an insulating layer of an optoelectronic semiconductor component, for example. Preferably, the coating is a thin layer, namely with a thickness of 10 µm at most, for example, of a material, which has preferably few impurities. That is, the layer preferably consists of the material and comprises for example 3% at most, in particular 1% of foreign substances at most. Preferably, the coating is formed with a material, which can be provided by means of a vaporization source as a material source.

According to at least one embodiment of the method, first a material source having a vaporization surface and a main coating direction is provided. The material source includes, in the interior thereof, the material for the coating, for example. If the coating comprises multiple materials or multiple material components, even multiple material sources or one material source can be used with multiple materials. The at least one material for the coating is released from the material source by means of heating or charged particle bombardment, for example.

The main radiation of the material source is effected along the main coating direction. In other words, a material flow released by the material source is maximal along the main coating direction. The material flow may be minimal in at least one extension direction of the vaporization surface of the material source, i.e. vertically to the main coating direction.

According to at least one embodiment of the method, a substrate holder with a top surface is provided. Preferably, the top surface has a planar design. In other words, the course of the top surface deviates from a virtual mathematical plane, which runs through the top surface, by +/−10% at the most, preferably +/−5% at the most, of the thickness of the substrate holder, perpendicular to said plane.

The top surface of the substrate holder faces the material source. A virtual extension of the top surface encloses an angle of less than 90° with the main covering direction. In the present case, the substrate holder may be a rotary disk, for example. In general, it is possible for the substrate holder to be formed from a mechanically self-supporting material. In other words, a further supporting element protecting the substrate holder from being damaged is not required for the transport of the substrate holder. Here, the substrate holder may be formed from multiple layers, wherein the top surface of the substrate holder may be formed with a semiconductor material. The top surface of the substrate holder comprises silicon, for example.

According to at least one embodiment of the method, a base layer is arranged on the top surface of the substrate holder. The base layer comprises a coating surface facing away from the substrate holder. The base layer may be the element to be coated, e.g. the substrate to be coated. The coating surface faces the material source. As a result, a material vaporized from the material source can be applied to the coating surface. Furthermore, the base layer preferably comprises four side surfaces. Here, choosing the term "coating surface" shall not mean that exclusively this surface is provided with a coating. Rather, preferably, also the side surfaces of the base layer are provided with the coating. The coating surface rather is a main coating surface, i.e. the surface where quantitatively the most material is deposited from the material source, due to its position relative to the material source, and due to its geometric dimensions.

For example, the base layer is designed in the shape of a cuboid, a truncated pyramid or a truncated cone. Here, the four side surfaces may connect the coating surface and a bottom surface of the base layer facing the top surface of the substrate holder. The base layer may be a not yet finished optoelectronic semiconductor component, for example. That means that the base layer may comprise layers and/or structures of an optoelectronic semiconductor component.

According to at least one embodiment of the method, the substrate holder is attached to a rotating arm having a main extension direction. The rotating arm is attached to a bottom surface of the substrate holder facing away from the top surface of the substrate holder. The rotating arm is preferably fixedly connected to the bottom surface of the substrate holder. The main extension direction of the rotating arm runs vertically to the bottom surface of the substrate holder. The rotating arm has a length in its main extension direction. For example, the end of the rotating arm—facing away from the substrate holder—is fixed to a rotary joint. The attachment may, for example, be effected mechanically by means of a screw connection.

Preferably, a virtual extension of a substrate axis of rotation of the substrate holder runs along the main extension direction of the rotating arm. Here, the substrate axis of rotation extends from the top surface to the bottom surface of the substrate holder. Preferably, the substrate axis of rotation runs through a center of mass of the substrate holder. Here and in the following, the term "center of mass" is not to be understood as a geometrically exact center of mass, but merely as a center of mass within the production tolerances. For example, the center of mass deviates from the geometrically exact center of mass with regards to a diameter of the substrate holder by up to 15%, preferably by up to 10%.

According to at least one embodiment of the method, the length of the rotating arm is adjusted. For example, adjusting may be effected by selection of a rotating arm with a corresponding length. Furthermore, the length adjustment may be effected by means of a displacement of the rotary joint in the direction away from the substrate holder or by a displacement of the fastening point of the rotating arm on the rotary joint.

According to at least one embodiment of the method, the length of the rotating arm is adjusted such that a normal angle is at least 30° and at most 75° throughout the entire method. Preferably, the normal angle is at least 40° and at most 60°. Here, the normal angle is the angle which is enclosed by a surface normal of the coating surface of the base layer through a sample point on the coating surface, and a sample vector. The sample vector is derived from the connection vector from any point on the vaporization surface of the material source to the sample point on the coating surface of the base layer. Preferably, a point through which the main coating direction runs, not an arbitrary point, is selected as a point on the vaporization surface of the material source.

For example, the normal angle may be an angle which is enclosed by a virtual extension of the rotating arm in the direction of the material source and a connection vector from the material source to the fastening point of the rotating arm.

According to at least one embodiment of the method, now, at least one coating is applied to the side of the base layer that has the coating surface. Hereafter, this application will also be referred to as a "coating process" and is effected during a coating time. The coating has a coating thickness. Here and in the following, the term coating thickness relates to the respective shortest distance of an external surface of the coating facing away from the base layer toward the top surface or toward one of the side surfaces of the base layer located underneath the coating.

Application of the coating is effected via the material source. For example, the coating is applied by vapor deposition by means of the material source. Coating is effected during a coating time, wherein said coating time is preferably selected to be so long that a complete covering of the coating surface and/or the side surfaces of the base layer results. Here and in the following, the term "complete covering" of the base layer means that all exposed external surfaces of the base layer facing away from the substrate holder are no longer freely accessible after the coating and that the entire surface is covered by the coating. Thus, the coating is particularly a closed layer and does not comprise multiple materials, which are not interconnected with material of the coating.

According to at least one embodiment of the method, the substrate holder is rotated around the substrate axis of rotation during the coating of the at least one coating. Rotation is preferably effected with a constant rotary frequency. In other words, the rotary frequency is not changed during the coating time and the coating process, respectively. The substrate axis of rotation runs along the main extension direction of the rotating arm. Preferably the rotating arm is rotated around itself. The self rotation of the rotating arm can be realized with the rotary joint, on which the rotating arm is attached, for example.

Here, it is to be observed that the normal angle varies during the coating process due to the rotation of the substrate holder. The reason for this lies with the fact that the substrate axis of rotation, along which the rotation is effected, generally does not run through the base layer. With respect to the position of the substrate axis of rotation, the base layer is closer to the material source at the start of the production method, for example. Due to the rotation and with respect to the position of the substrate axis of rotation, the base layer is located farther away from the material source at a later point in time during the coating process. The distance of the base layer to the material source varies over time due to the rotation around the substrate axis of rotation. This results in a change of the sample vector and thus a change of the normal angle. Despite the variability, the normal angle is at least 30° and at most 75° throughout the entire production method.

According to at least one embodiment of the method for producing a coating, the method comprises the following steps:
  providing a material source with a top surface and a main coating direction,
  providing a substrate holder with a top surface,
  providing at least one base layer with a coating surface facing away from the substrate holder on the top surface of the substrate,
  attaching the substrate holder on a rotating arm, which has a length along a main extension direction of the rotating arm,
  adjusting the length of the rotating arm in such a way that a normal angle, which is formed by the surface normal of the coating surface of the base layer through a sample point on the coating surface and a sample vector, derived from the connection vector from a point on the top surface of the material source to the sample point on the coating surface, is at least 30° and at most 75° throughout the entire method,
  applying at least one coating on the side of the base layer that has the coating surface by means of the material source, wherein
  the substrate holder during the coating process of the coating is rotated around a substrate axis of rotation which runs along the main extension direction of the rotating arm.

The idea underlying the described method here, particularly, is that a uniform coating of the base layer can be achieved by exactly adjusting the length of the rotating arm in such a manner that the normal angle is at least 30° and at most 75°. As a result, a conformable coating of edges and/or corners of the base layer is enabled. Furthermore, the production of crack-free and thus hermetically sealed coatings is enabled.

According to at least one embodiment of the method, the substrate holder is additionally rotated around an overall axis of rotation, which runs along the main coating direction of the material source within the production tolerances. Preferably, rotation is effected throughout the entire coating process. Irregularities in the material flow vaporized from the material source can be compensated by means of the rotation around the overall axis of rotation.

By means of the simultaneous rotation around the substrate axis of rotation and the overall axis of rotation, a uniform, conformable coating is achieved in the present case. By means of the rotation around the substrate axis of rotation, it is particularly possible to coat the side surfaces of the base layer in a uniform fashion. As already described with regards to the rotation-dependent change of the normal angle, the distance of the base layer to the material source changes during rotation around the substrate axis of rotation. Thus, when coating two base layers, for example, which may initially have a different distance to the material source, irregularities in the coating thickness due to the different distance can be compensated.

Such irregularities in the coating thickness could be traced back to the fact that the material flow released by the material source decreases quadratically along with a decreasing distance to the material source (so-called distance-square law). Thus, a first base layer, which is initially closer to the material source than a second base layer, is farther away from the material source than the second base layer at a later point of time. Furthermore, due to rotation, it is possible that the side surfaces of the base layer are coated in a uniform manner, since in each case another side surface faces the material source during rotation around the substrate axis of rotation. The respective orientation of each of the side surfaces relative to the material source, in particular to the main coating direction of the material source, is thus varied during the coating process by the rotation around the substrate axis of rotation.

In addition, the rotation around the overall axis of rotation causes a compensation of irregularities in the material flow released by the material source. Ideally, the material flow would have a rotation symmetry relative to the main coating direction, and thus relative to the overall axis of rotation. However, material flows of real material sources deviate from the rotation symmetry. The deviation is compensated by the rotation around the overall axis of rotation.

According to at least one embodiment of the method, rotation around the substrate axis of rotation is effected with a first rotary frequency, and rotation around the overall axis of rotation is effected with a second rotary frequency. Here, the first rotary frequency is greater than the second rotary frequency. For example, the first rotary frequency is at least four times, preferably 5.25 times greater than the second rotary frequency. In other words, rotation around the substrate axis of rotation is significantly more rapid than the rotation around the overall axis of rotation. The different selection of rotary frequencies accounts for the fact that the irregularities in the coating thickness, which could result from a different orientation of the side surfaces to the material source, are significantly greater than the irregularities in the coating thickness, which could result from an inhomogeneity in the material flow of the material source.

According to at least one embodiment of the method, an arbitrary point on the coating surface is selected as the sample point. In other words, the surface normal of the coating surface defining the normal angle may run through any point on the coating surface of the base layer. As a result, each normal angle of any surface normal of the coating surface through an arbitrary sample point on the coating surface with a sample vector fulfils the above condition throughout the entire coating time that the normal angle is at least 30° and at most 75°.

According to at least one embodiment of the method, a plurality of base layers with in each case one coating surface are arranged on the top surface of the substrate holder. Each normal angle of each coating surface of each of the plurality of base layers is at least 30° and at most 75°.

According to at least one embodiment of the method, the length of the rotating arm is adjusted in such a manner that the length is at least 100 mm and at most 700 mm. The selection of the length of the rotating arm depends on the size of the coating apparatus and scaled therewith. Preferably, the length is at least 200 mm and at most 400 mm and very preferably at least 220 mm and at most 300 mm. In this case, a selection of the length of the rotating arm in this region allows the provision of both a normal angle, which is at least 30°, and a great number of substrates, without that they touch one another due to limited space, and/or a top surface of a substrate holder is shadowed by the material flow from the material source.

According to at least one embodiment of the method, the coating completely covers over all edges and corners of the base layer facing away from the substrate holder. In other words, the base layer is covered by the coating conformably and without gaps. The base layer is no longer freely accessible on the external surfaces facing away from the substrate holder, i.e. on its coating surface and all side surfaces, after applying the coating. Just as well, the edges and corners of the base layer are completely covered. Here and in the following, an edge of the base layer is a place where a side surface encounters the coating surface. Here and in the following, a corner of the base layer is a place where two side surfaces and the coating surfaces coincide. A square-shaped base layer comprises four edges facing away from the substrate holder and four corners facing away from the substrate holder, for example. A truncated cone shaped base layer comprises merely one edge facing away from the substrate holder, where the shell surface encounters the top surface of the truncated cone, for example. Here, the terms "edge" and/or "corner" are not to be understood as strictly geometrical terms, but rather include within the production tolerances rounded edges and/or corners.

According to at least one embodiment of the method, the substrate holder has a disk-shaped design. The top surface and/or the bottom surface of the substrate holder then have the shape of a circle. Here, the radius of the circular top surface and/or the circular bottom surface of the substrate holder is at least 30 mm and at most 350 mm. Preferably, the radius is at least 40 mm and at most 200 mm, particularly preferably at most 120 mm. Here, the substrate axis of rotation runs through a center point of the circular top surface and/or the circular bottom surface. Here, the terms "circle", "circular", "disk", "disk-shaped", "radius" and "center point" are not to be understood as exact geometric terms but rather as information that is to be interpreted within the production tolerances. For example, the top surface and/or the bottom surface may have the shape of an almost circular ellipsis, wherein the numeric eccentricity of the ellipsis may be at most 10%.

Here, it is possible that the contour of the substrate holder in a plan view can be merely approximated by the shape of a circle. For example, the substrate holder may have the shape of a clover-leaf, in particular of a four-leaf clover, in a plan view. The shape of the clover-leaf can then be encircled with a circle in a plan view. Here, in a plan view, the substrate holder may have at least one axis of symmetry, preferably at least two axes of symmetry and particularly preferably at least four axes of symmetry. The substrate holder may have an extension of at least 30 mm and at most 350 mm in at least one spatial dimension.

According to at least one embodiment of the method, at least two substrates and at least two rotating arms are provided. Preferably, in each case a plurality of base layers is arranged on each of the substrates. The two substrates are in each case arranged on one rotating arm, wherein each substrate holder is uniquely assigned to one rotating arm. Preferably, the two rotating arms have an equal length within the production tolerances. However, it is also possible that the rotating arms have a different length. This enables a different coating of the base layers arranged on the two substrates, for example.

The two substrates each rotate around a substrate axis of rotation, through which the main extension direction of the respective rotating arm runs, respectively. Preferably, both substrates rotate with the same first rotary frequency. However, it is also possible that the rotary frequencies of the two substrates differ from one another. This may be the case, for example, if structurally different coatings are to be applied to the base layers of the two substrates.

According to at least one embodiment of the method, the at least two substrates and the material source are not arranged on a common surface of a sphere. For example, the two substrates may be arranged on a common surface of a sphere, with the material source not being arranged on this common surface of a sphere. Thus, it is not possible to define a sphere in space on the surface of which both the two substrates and the material source are arranged at least in places.

In contrast to this, the substrates and the material source of a so-called Knudsen gear or planetary gear are arranged on a common surface of a sphere. In contrast to the method described herein, a coating method with such a Knudsen gear or planetary gear, respectively, comes with the disadvantage that no uniform covering of the edge(s) of the base layer with the coating results, but rather an asymmetry of the over-coating depending on the orientation and the position of the base layers on the substrate holder. Moreover, gaps and cracks develop in the coating, in the area of the edges to be coated, during the coating process, using such a Knudsen gear or planetary gear, respectively.

Furthermore, an optoelectronic semiconductor component is provided. A coating of the optoelectronic semiconductor component is preferably produced with the method described herein. That is, all features disclosed for the method are also disclosed for the coating of the optoelectronic semiconductor component and vice versa.

According to at least one embodiment of the optoelectronic semiconductor component, the component comprises at least one base layer with a coating surface and two radial side surfaces disposed opposite one another. Furthermore, the base layer comprises two tangential side surfaces opposite one another, which run transversely or perpendicularly to the radial side surfaces within the production tolerances. Preferably, in each case two radial side surfaces adjoin one tangential side surface and vice versa. For example, the base layer is designed in the shape of a cuboid or a truncated pyramid. The radial side surfaces may then be arranged parallel to one another within the production tolerances. Just as well, the tangential side surfaces may be arranged parallel to one another within the production tolerances. Here, the radial side surfaces can be the side surfaces which face toward or face away from the substrate axis of rotation, respectively. The tangential side surfaces can be the side surfaces which comprise at least one surface normal, which run along the direction of rotation of the first rotary frequency.

The base layer further comprises a bottom surface and edges and corners facing away from the bottom surface, where the tangential respectively radial side surfaces encounter the coating surface.

According to at least one embodiment of the optoelectronic semiconductor component, the component comprises at least one coating. The coating completely covers the edges and corners of the base layer. In other words, the coating covers the base layer conformably. For example, the coating may be an insulating layer of the optoelectronic semiconductor component. Furthermore, the coating may be a reflective layer and/or an electrically conductive connection layer of the optoelectronic semiconductor component. It is also possible that the coating is a semiconductor layer of the optoelectronic semiconductor component. By means of a conformable coating, for example, the base layer can be hermetically sealed toward the outside and be protected against the intrusion of air and/or liquids. Furthermore, a conformable coating can be used for the production of highly-reflective layers.

The material of the coating may have a high purity. For example, the quantity proportion of the impurity atoms in the coating is at most 3%, preferably at most 1%, of the atoms of the material of the coating. Inter alia, the production by means of vapor deposition can be substantiated via the purity of the material of the coating. The feature according to which the coating has been produced by means of vapor deposition is thus an object feature that can be verified on the finished component.

According to at least one embodiment of the optoelectronic semiconductor component, this component comprises at least a base layer having a coating surface, two radial side surfaces opposite one another, two tangential side surfaces opposite one another, which run transversely or perpendicular to the radial side surfaces within the production tolerances, a bottom surface and edges and corners facing away from the bottom surface, and at least one coating, wherein the coating completely covers the edges and corners of the base layer.

According to at least one embodiment of the optoelectronic semiconductor component, the coating comprises external surfaces. The coating thickness on at least one radial side surface of the base layer is at least 25% of the coating thickness on the coating surface of the base layer. In other words, the coating thickness of the coating has a uniform design. Here and in the following, the coating thickness on a radial side surface and/or on a tangential side surface and/or on the coating surface of the base layer is the minimum distance of at least one of the external surfaces of the coating to the radial side surface and/or the coating surface.

Furthermore, by means of a comparison between the coating thickness on at least one radial side surface and the coating thickness on the coating surface, the normal angle selected during the method can be verified. Thus, the coating thickness on the radial side surfaces increases along with an increasing normal angle. In a normal angle of 75°+/−5°, the coating thickness on the at least one radial side surface may correspond to the coating thickness on the coating surface. Thus, an optimal uniform coating may result with this angle. However, in the present case, it turned out that under consideration of further factors, such as the number of the base layers attached on the substrate holder and/or the size of the substrate holder, an optimum in uniformity can already be achieved as from a normal angle of 30°.

According to at least one embodiment of the optoelectronic semiconductor component, the coating thickness on a tangential side surface of the base layer is at least 30% of the minimum distance of the external surfaces to the coating surface of the base layer. Thus, the tangential side surfaces can be coated in a more uniform manner than the radial side surfaces.

According to at least one embodiment of the optoelectronic semiconductor component, the coating in the area of the radial side surfaces and/or the tangential side surfaces of the base layer is free from cracks completely penetrating the layer. In other words, crack-free coatings and/or hermetically sealed coatings can be produced by the method for producing a coating as provided herein.

In the following, the method for producing a coating described herein, as well as the optoelectronic semiconductor component described herein, having a coating that has been produced by means of a method will be described in greater detail with regards to exemplary embodiments and the associated Figures.

Figure 1:
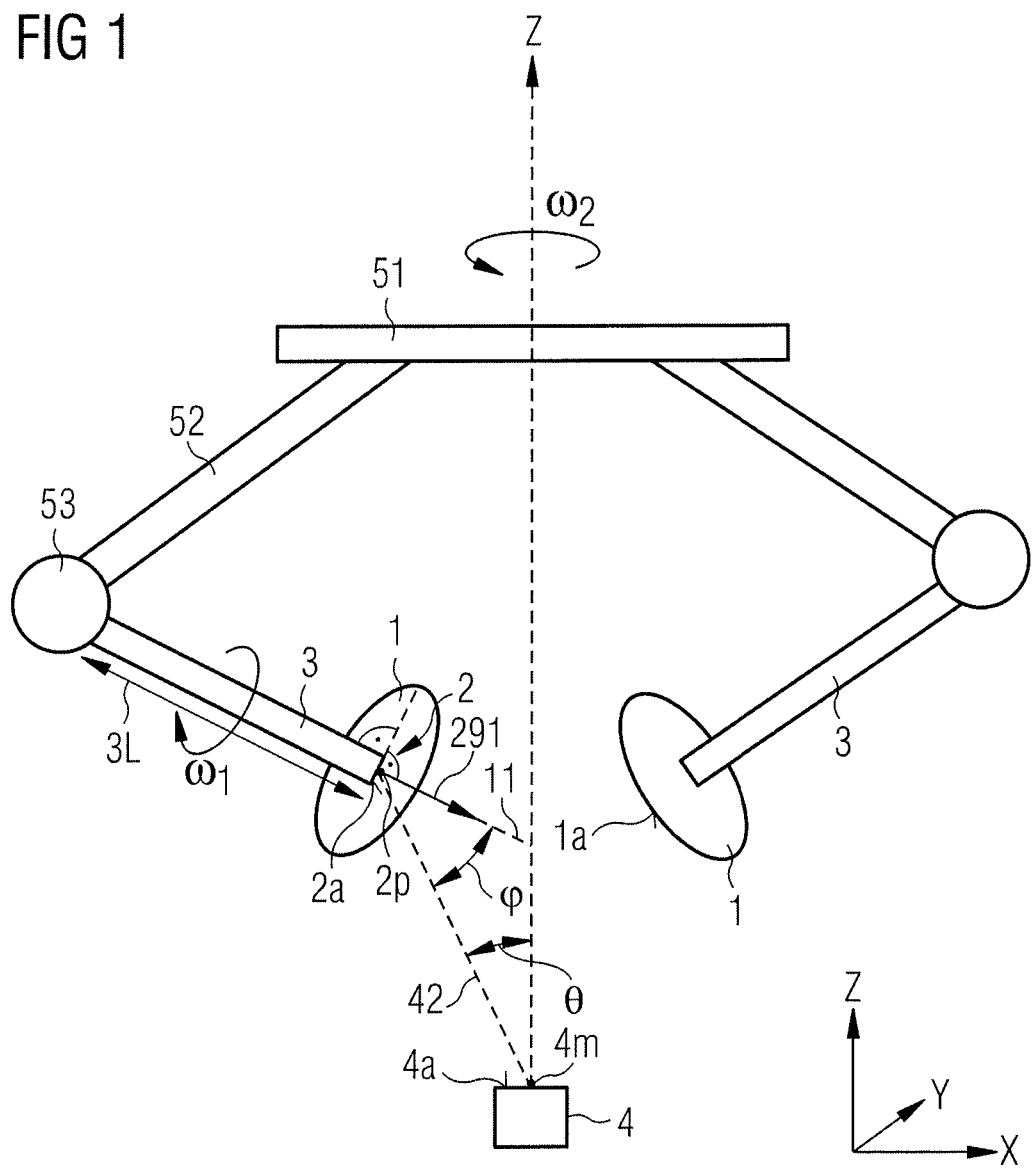
FIG. 1 shows an exemplary embodiment of an arrangement for performing a method described herein by means of a schematic side view.

Like, similar or equivalent elements are provided with like reference numerals throughout the figures. The figures and the dimensional relations of the elements illustrated in the drawings are understood to not be made to scale. Rather, individual elements can be illustrated in an exaggerated manner for a better illustration and/or a better understanding.

By means of the schematic side view of FIG. 1, a method for producing a coating is explained in greater detail. The side illustration shows a sketched arrangement for the production of a coating 22. The arrangement comprises a material source 4 with a vaporization surface 4a. The material source 4 comprises a main coating direction Z. The main coating direction Z forms a Cartesian coordinate system X, Y, Z together with the two directions X, Y spanning the plane of the vaporization surface 4a.

Furthermore, the arrangement comprises a rotation holder 51, a fastening arm 52 and a rotary joint 53. The rotary joint 53 is fixed to the rotation holder 52 by means of the fastening arm 52. A rotating arm 3 is attached to the rotary joint 53. The rotating arm 3 has a length 3L in its main extension direction. A substrate holder 1 is attached to the rotating arm 3. A virtual extension of the rotating arm 3 through the substrate holder 1 runs preferably through a center of mass of the substrate holder 1. A second substrate holder 1 on a second rotating arm 3 is illustrated on the right side of FIG. 1. Here, the structure is the same as that on the left side of FIG. 1.

The entire arrangement including the rotation holder 51, fastening arm 52, rotary joint 53, rotating arm 3 and substrate holder 1 rotates with a second rotary frequency $\omega_2$ around an overall axis of rotation, which runs along the main coating direction Z of the material source 4. Furthermore, the rotating arm 3 performs a self rotation with a first rotary frequency $\omega_1$ around a substrate axis of rotation 11, which runs along the main extension direction of the rotating arm 3.

The substrate holder 1 comprises a top surface 1a. A base layer 2 is attached on the top surface 1A. A sample point 2p is marked on a coating surface 2a of the base layer 2. In the present case, the sample point 2p is selected, such that a virtual extension of the substrate axis of rotation 11 running along the rotating arm 3 runs through the sample point 2p. However, the sample point 2p can be selected arbitrarily on the coating surface 2a of a base layer 2.

The connection vector from a point 4m on the vaporization surface 4a of the material source 4 to the sample point 2p forms the sample vector 42. A normal angle $\varphi$ is enclosed by the sample vector 42 and a surface normal 291 through the sample point 2p. The normal angle $\varphi$ is set by means of a variation of the length 3L of the rotating arm 3. Here, the normal angle $\varphi$ is at least 30° and at most 75°. Preferably, the normal angle $\varphi$ is at least 40° and at most 60°.

Figure 2:
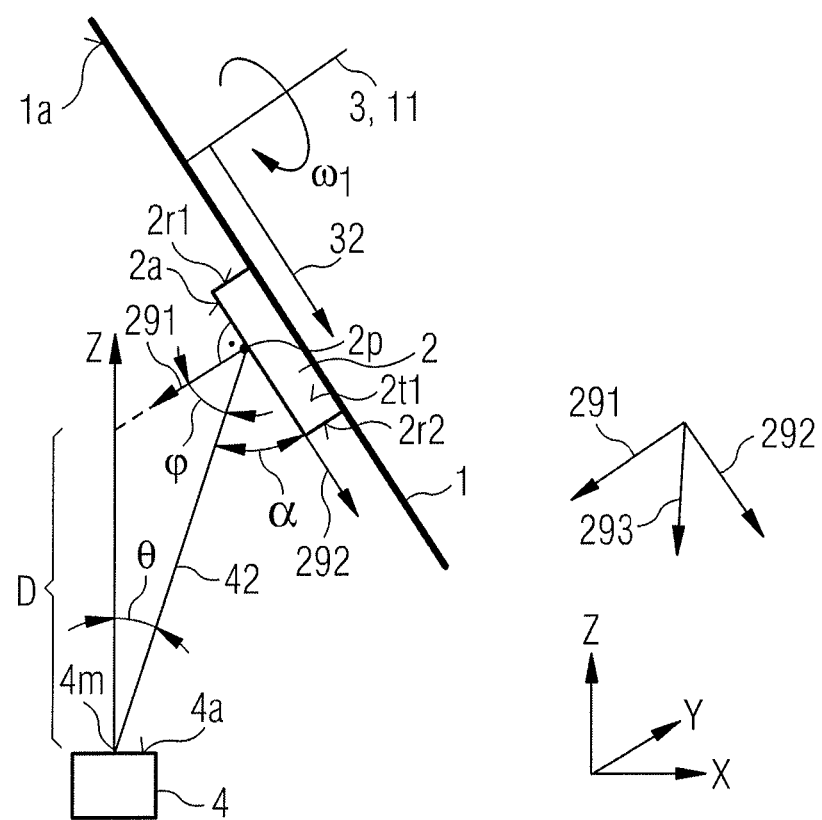
FIGS. 2, 3 and 4 show schematic sketches for explaining a method described herein in greater detail.

According to the schematic sketch of FIG. 2, a method for producing a coating is explained in greater detail. FIG. 2 shows the material source 4 with the vaporization surface 4a and a point 4m on the vaporization surface 4a of the material source 4. The main coating direction Z of the material source 4 runs through the point 4m on the vaporization surface 4a. The sketch also shows the substrate holder 1, which is arranged on the rotating arm 3, along the main extension direction of which runs the substrate axis of rotation 11. The rotating arm 3 rotates with the first angular velocity $\omega_1$ around the substrate axis of rotation 11.

The base layer 2 is arranged on the top surface 1a of the substrate holder 1. The base layer 2 comprises a coating surface 2a as well as radial side surfaces 2r1, 2r2 and tangential side surfaces 2t1, 2t2. The positive radial side surface 2r1 can be found on the side of the base layer 2 facing the rotating arm 3 and the negative radial side surface 2r2 can be found on the side of the base layer 2 facing away from the rotating arm 3. The positive tangential side surface 2t1 precedes the negative tangential side surface 2t2 (not shown in FIG. 2) in the rotation direction around the substrate axis of rotation 11. In other words, at least one surface normal of the positive tangential side surface 2t1 runs parallel to the rotation direction and at least one surface normal of the negative tangential side surface 2t2 runs antiparallel to the rotation direction. The radial side surfaces 2r1, 2r2 are located opposite one another. Just as well, the tangential side surfaces 2t1, 2t2 are located opposite one another (not shown in FIG. 2). Within the production tolerances, the tangential side surfaces 2t1, 2t2 run perpendicular to the radial side surfaces 2r1, 2r2.

A sample point 2p is located on the coating surface 2a of the base layer 2. The sample point 2p has a distance 32 from the rotating arm 3. Furthermore, the base layer 2 has a medium distance D to the material source.

The sample vector 42, derived from the connection vector from point 4m on the vaporization surface 4a of the material source 4 to the sample point 2p on the coating surface 2a of the base layer 2, encloses a material angle $\theta$ with the main coating direction Z. Just as well, the sample vector 42 encloses a normal angle $\varphi$ with the surface normal 291 through the sample point 2p.

The radial vector 292 runs along the coating surface 2a. The radial vector 292 is perpendicular to the surface normal 291 through the sample point 2p. The radial vector 292 encloses a radial angle $\alpha$ with the sample vector 42. The surface normal 291, the radial vector 292 and a tangential vector 293 (not shown here) form a three-dimensional Cartesian coordinate system, which is rotated relative to the Cartesian coordinate system X, Y, Z defined by the material source 4. The tangential vector 293 runs perpendicular to the surface normal 291 and the radial vector 292 and runs out of the image plane of FIG. 2.

At the point of time shown in FIG. 2, during the coating process, the negative radial side surface 2r2 is oriented toward the material source 4 and can thus be directly coated, while the positive radial surface 2r1 is oriented away from the material source 4 and can thus only be poorly coated or not coated at all. The positive radial side surface 2r2 can thus be coated better with the material of the material source 4. At a later point in time, e.g. after a half turn of the substrate holder 1 around the substrate axis of rotation 11, the positive radial side surface 2r1 will be oriented toward the material source 4 and the negative radial side surface 2r2 will be oriented away from the material source 4. Thus, a uniform coating of the radial side surfaces 2r1, 2r2 will be enabled by the rotation around the substrate axis of rotation 11.

Figure 3:
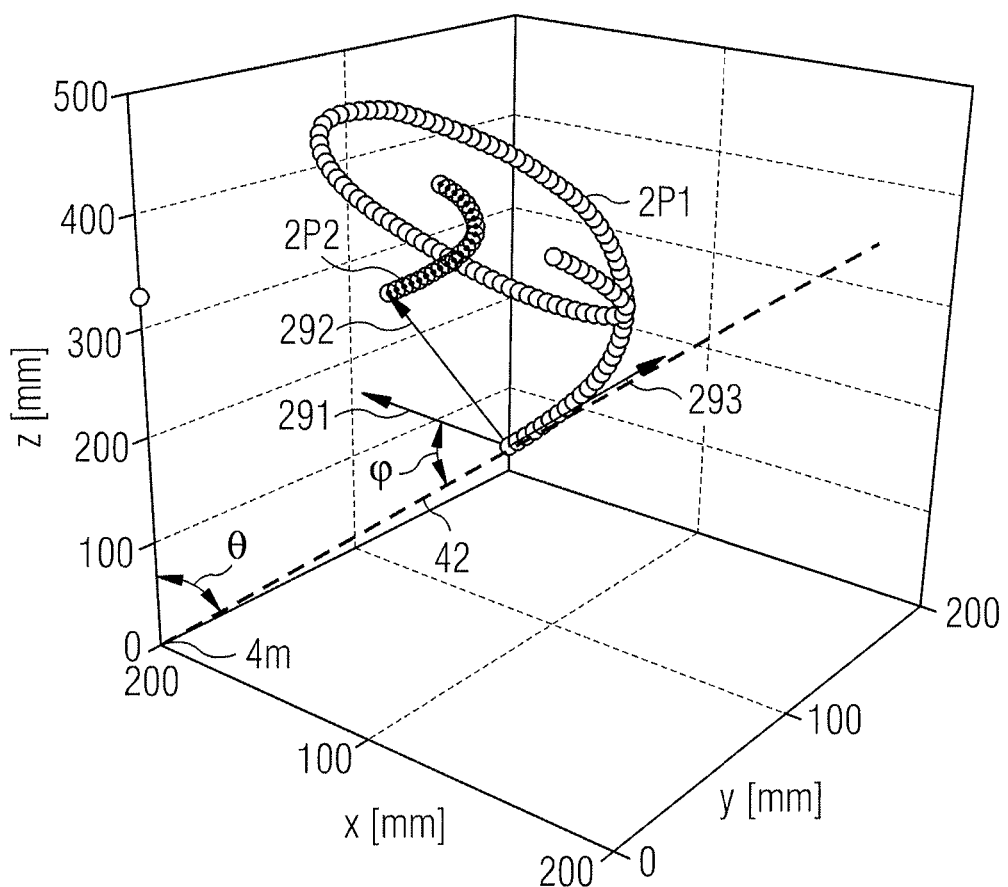

According to the schematic illustration of FIG. 3, a method for producing a coating 22 described herein is explained in greater detail. Calculated time-dependent positions of sample points 2p1, 2p2 on the coating surface 2a of the base layer 2 in the coordinate system X, Y, Z defined by the material source 4 are illustrated. The point of origin is derived from a point 4m on the vaporization surface 4a of the material source 4.

The first sample point 2p1 is arranged, such that distance 32 to the substrate axis of rotation 11 is great. The second sample point 2p2 is arranged such that it only deviates slightly from the position of the substrate axis of rotation 11, i.e. it has an infinitesimally small distance 32 to the substrate axis of rotation 11. The time-dependent position of the first sample point 2p1 is thus influenced by both the rotation around the substrate axis of rotation 11 and the rotation around the overall axis of rotation. The time-dependent position of the second sample point 2p2 is merely influenced by the rotation around the overall axis of rotation.

This different influence can for example be discerned from the greater time variation of the position of the first sample point 2p1 compared over the time variation of the position of the second sample point 2p2. The first sample point 2p1 performs a double rotation around the material source 4. The first sample point 2p1 thus has a more complex movement than the second sample point 2p2 and includes a greater variation of normal angles φ with the sample vector 42.

Furthermore, FIG. 3 shows a sketched three-dimensional illustration of the rotated Cartesian coordinate system 291, 292, 293 spanned by the surface normal 291, the radial vector 292 and the tangential vector 293. The tangential vector 293 runs parallel to the rotation direction of the rotation around the substrate axis of rotation 11 with the first rotary frequency $\omega_1$. The radial vector 292 runs parallel to the coating surface 2a, on which the sample point 2p1, 2p2 is located.

Figure 4:
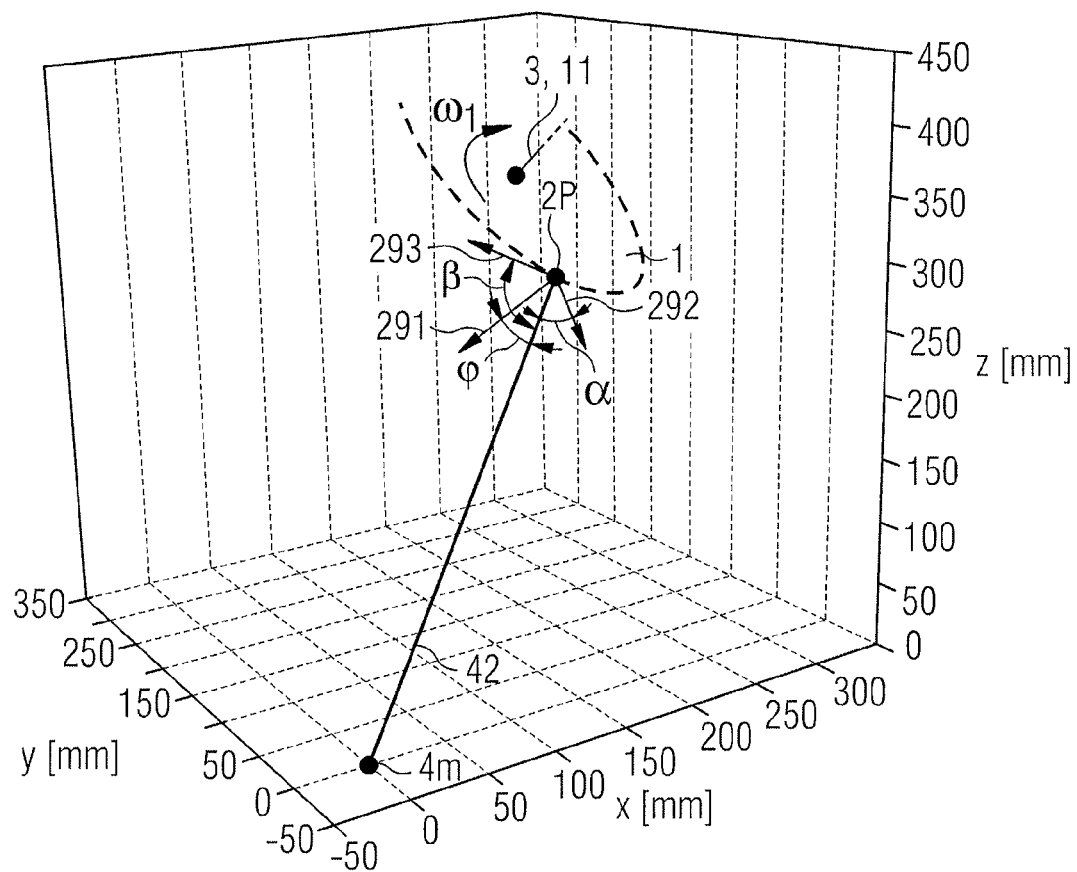

According to the sketch of FIG. 4, a method for producing a coating is explained in greater detail. The sketch shows a sample point 2p at an arbitrary point in time during the coating process. Furthermore, the rotating arm 3 and the substrate axis of rotation 11 coinciding with the rotating arm 3 is shown. The rotated Cartesian coordinate system 291, 292, 293 is illustrated at the position of the sample point 2p.

The surface normal 291 encloses the normal angle φ with the sample vector 42. The radial vector 292 encloses a radial angle α with the sample vector 42. The tangential vector 293 encloses a tangential angle β with the sample vector 42.

Due to the rotation around the substrate axis of rotation and/or the overall axis of rotation, the radial angle α, the tangential angle β and the normal angle φ vary during rotation of the substrate holder 1.

Figure 5:
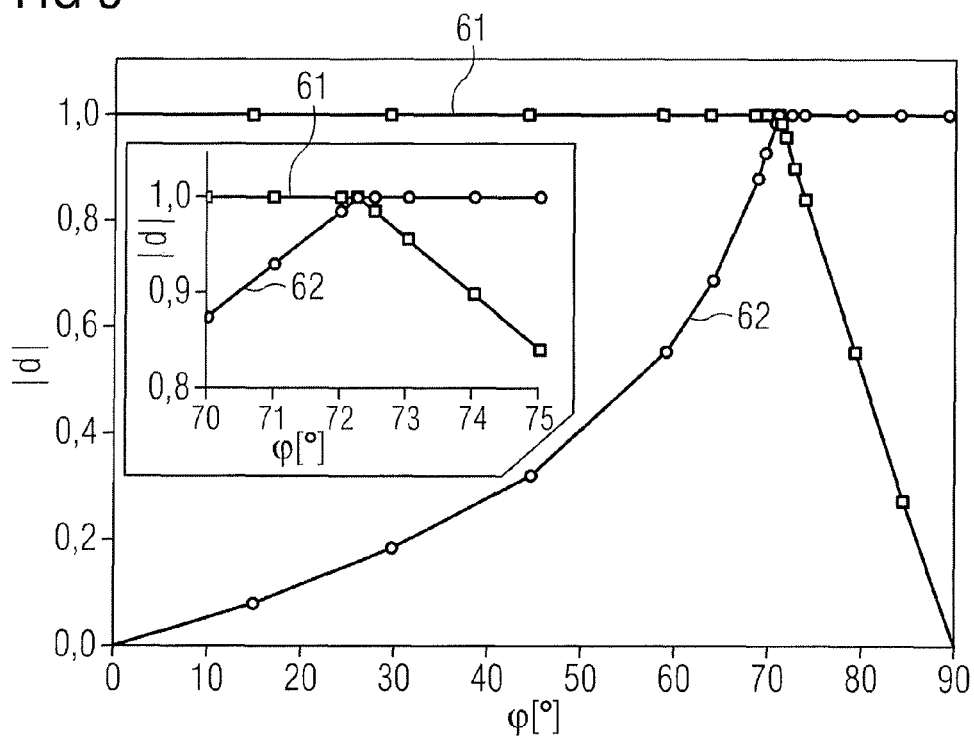
FIG. 5 shows an angular dependence of the coating thickness of a coating for the explanation of a method described herein.

According to the calculated angle dependence of the normalized coating thicknesses 61, 62 of FIG. 5, a method for producing a coating is explained in greater detail. What is illustrated is the coating thickness |d|, normalized to the coating thickness on the coating surface 2a, as a function of the normal angle φ in degree. FIG. 5 shows the normalized coating thickness 61 on the coating surface 2a and the normalized medium coating thickness 62 on the side surfaces 2r1, 2r2, 2t1, 2t2 of the base layer 2, which represents a medium value of the respective normalized coating thicknesses on the respective side surfaces 2r1, 2r2, 2t1, 2t2.

For the calculation of the coating thickness, it was assumed that the material flow I released by the material source 4 has the following proportional dependence on the material angle θ and the medium distance D of the base layer 2 from the material source 4:

$$I(\theta,D) \sim \cos(\theta)^n * D^{-2},$$

with the material parameter n depending on the material of the material source 4. For example, n=3 is true for the case of gold. Thus, a rotation-symmetrical cosine-dependence in conjunction with the distance-square law is assumed for the material flow I.

The normalized medium coating thickness 62 on the side surfaces 2r1, 2r2, 2t1, 2t2 increases along with an increasing normal angle φ. A maximally uniform coating is achieved with a normal angle φ of approximately 72.4°. At this angle, the normalized medium coating 62 on the side surfaces 2r1, 2r2, 2t1, 2t2 and the normalized coating thickness 61 on the coating surface 2a have the same size. Thus, at the angle of 72.4°, a maximally conformable and homogenous coating of the base layer 2 can be expected.

However, it turned out that a sufficiently homogenous and conformable coating of the base layer 2 can already be achieved from a normal angle of at least 30°. In addition, a higher number of base layers 2 is possible with smaller normal angles φ, since the substrate holders 1 can be located farther away from the material source 4 and thus a greater number of substrate holders 1 and/or greater substrate holders 1 can be used in conjunction with one single material source 4.

Figure 6:
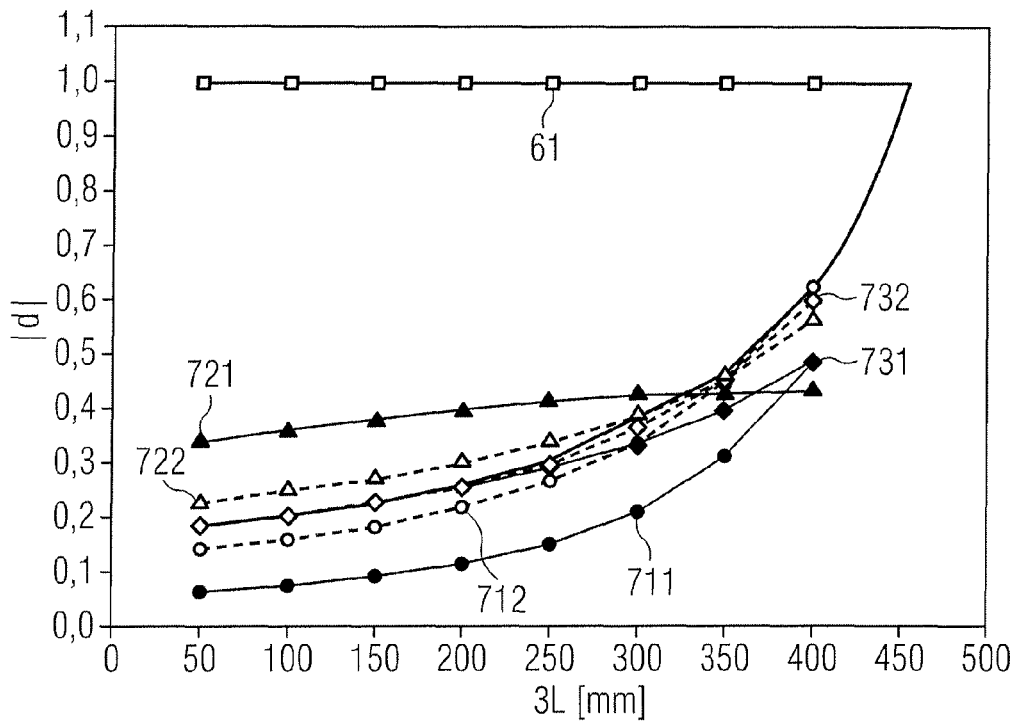
FIG. 6 shows a coating thickness of a coating as a function of the length of the rotating arm for the explanation of a method described herein.

According to the calculated normalized coating thicknesses 711, 712, 721, 722, 731, 732 of FIG. 6, a method for producing a coating described herein is explained in greater detail. In contrast to FIG. 5, the normalized coating thickness on the respective side surfaces 2r1, 2r2, 2t1, 2t2 is applied, respectively, in FIG. 6. The normalized coating thickness 711, 712, 721, 722, 731, 732 is indicated as a function of the length 3L of the rotating arm 3.

The points show as follows: the normalized coating thickness 711, 712 on the positive radial side surface 2r1, the normalized coating thickness 721, 722 on the negative radial side surface 2r1, the normalized coating thickness 731, 732 on the tangential side surfaces 2t1, 2t2 and the normalized coating thickness 61 on the coating surface 2a. The normalized coating thicknesses 731, 732 for the tangential side surfaces 2t1, 2t2 are not separately shown for the positive 2t1 and the negative 2t2 tangential side surface, since the normalized coating thicknesses of the two tangential side surfaces 2t1, 2t2 are the same. The filled data points 711, 721 and 731 respectively show the normalized coating thickness for a substrate holder having a diameter of 150 mm, while the non-filled points 712, 722, 732 respectively show the calculations of the normalized coating thickness for a substrate holder having a diameter of 50 mm.

Along with an increasing length 3L, the normal angle φ increases and thus the normalized coating thickness on the side surfaces 2r1, 2r2, 2t1, 2t2, also increase and, consequently, the uniformity of the coating thickness. In particular the tangential side surfaces 2t1, 2t2 can be coated homogeneously and conformably. At a length 3L of approximately 460 mm, the optimum normal angle φ of approximately 72.4° is achieved.

Figure 7:
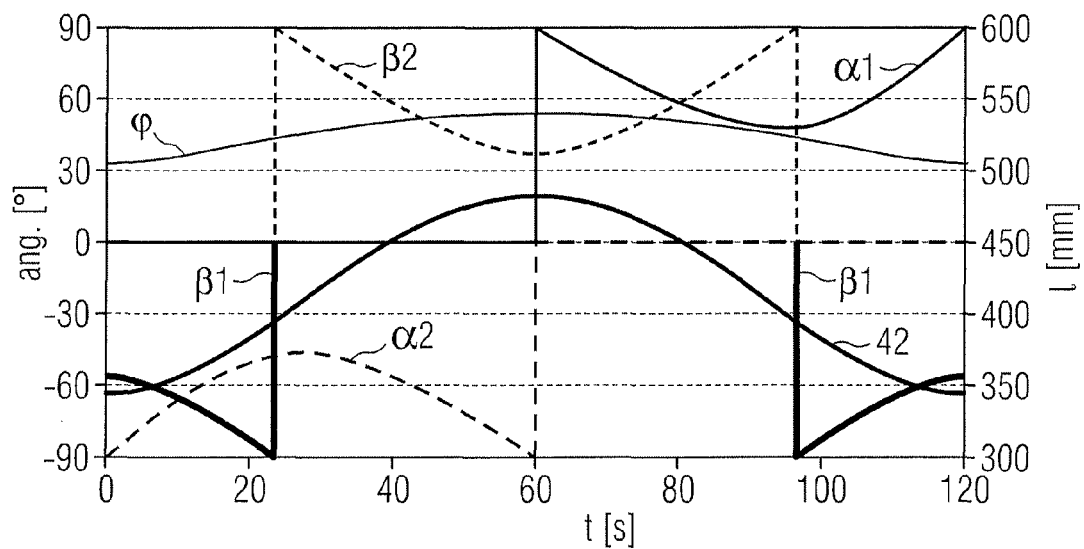
FIGS. 7 and 8 show the change over time of geometric relations, as well as of the coating thickness for the explanation of a method described herein.

According to the time-dependent course illustrated in FIG. 7, a method described herein is explained in greater detail. What is illustrated are the calculations of the normal angle φ, the tangential angle β1, β2, the radial angle α1, α2 as well as the material angle θ as a function of the rotation time t in seconds. Here, the rotation of the substrate holder is accounted for by the specification of a first tangential angle β1, a second tangential angle β2, a first radial angle α1 and a second radial angle α2. The sample vector 42 encloses the first tangential angle β1 respectively the first tangential angle α1 with the tangential vector 293 respectively with the radial vector 292. Furthermore, the sample vector 42 encloses the second tangential angle β2 respectively the second tangential angle α2 with the mathematically inverse, i.e. negative tangential vector 293 respectively the mathematically inverse, i.e. negative radial vector 292.

Furthermore, the time-dependent length of the sample vector 42 in millimeters is illustrated in the time-dependent course of FIG. 7. A rotation around the substrate axis of rotation 11 terminates after 120 seconds. The first rotary frequency $\omega_1$ is thus 1/120 Hz. Accordingly, the time-dependent course is repeated after 120 seconds.

The angles φ, α1, α2, β1, β2, θ and the length of the sample vector 42 change during the rotation. The normal angle φ is at least 30° and at most 75° throughout the entire rotation. The normal angle φ varies between 125° and 155°, corresponding to the acute angles 35° and 65°, for example.

Figure 8:
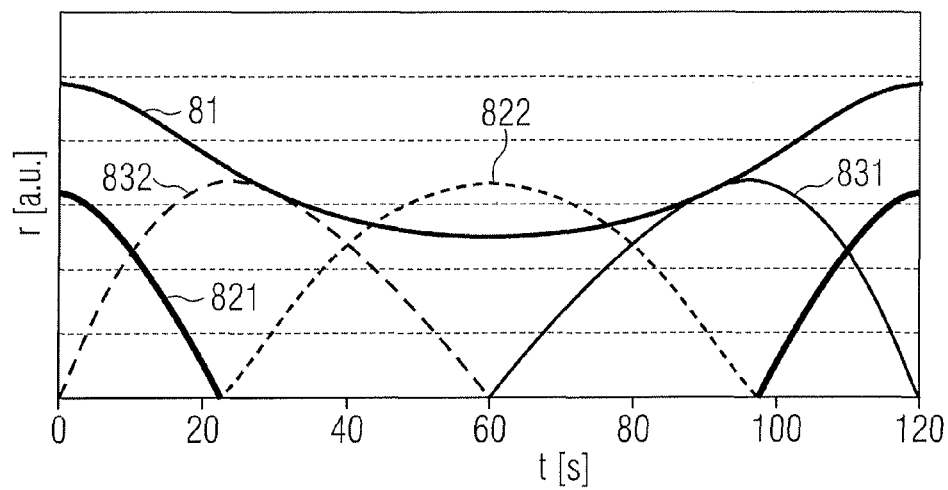

According to the time-dependent deposition rate of FIG. 8, a method for producing a coating 22 described herein is explained in greater detail. Here, the deposition rate is the rate with which material of the material source 4 is deposited on the respective surface 2a, 2r1, 2r2, 2t1, 2t2 of the base layer 2. The time-dependent deposition rate on the base layer 2 in arbitrary units (a.u.) as a function of the rotation time t in seconds is illustrated. FIG. 8 shows the deposition rate 81 on the coating surface 2a, the deposition rate 821 on the positive radial side surface 2r1, the deposition rate 822 on the negative radial side surface 2r2, the deposition rate 831 on the positive tangential side surface 2t1 and the deposition rate 832 on the negative tangential side surface 2t2.

The respective deposition rate of the coating changes over time. Thus, initially, the deposition rate 81 on the coating surface 2a and the deposition rate 821 on the positive radial side surface 2r2 are maximal. Along with the rotation around the substrate axis of rotation 11 the orientation of the side surfaces 2r1, 2r2, 2t1, 2t2 to the material source 4 is changed. Accordingly, the deposition rate 832 on the negative tangential side surface 2t2 increases, for example, while the deposition rate 81 on the coating surface 2a decreases. After a half turn, at the time t=60 s, the deposition rate 822 on the negative radial surface 2r2 is maximal. From a point in time of about t=80 s, the deposition rate 831 on the positive tangential side surface 2t2 and the deposition rate 81 on the coating surface 2a increase. Before the end of the rotation, from a point in time of about t=100 s, the deposition rate 811 on the positive radial surface 2r1 increases again. An integral over the respective curves then represents the coating thicknesses, according to FIGS. 5 and 6.

Figure 9A:
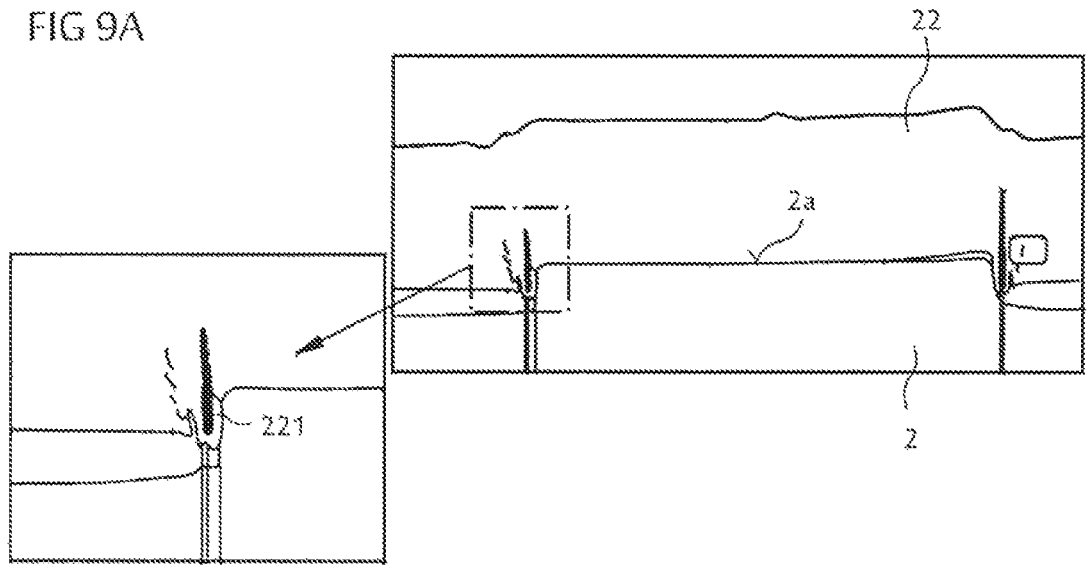
FIGS. 9A and 9B show exemplary embodiments of an optoelectronic semiconductor component described herein by means of schematic sectional illustrations and scanning electron microscope (SEM) images.
Figure 9B:
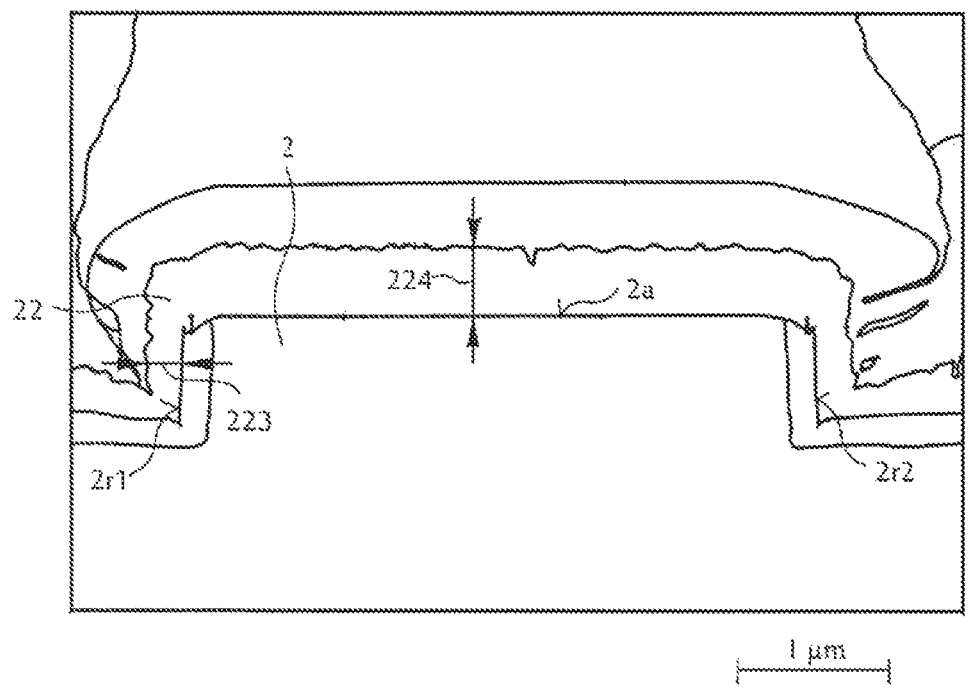

According to the SEM images of FIGS. 9A and 9B, the exemplary embodiments of the optoelectronic semiconductor component described herein are explained in greater detail. FIG. 9A shows the optoelectronic semiconductor component with a coating 22, which has not been produced by means of a method described herein. FIG. 9B shows an optoelectronic semiconductor component with a coating 22, which has been produced by means of a method described herein.

In the optoelectronic semiconductor component of FIG. 9A, cracks 221 can be discerned on the edges of the base layer 2 to be coated. These cracks in the coating 22 are not present in the optoelectronic semiconductor component of FIG. 9B. Furthermore, it is clearly discernable in FIG. 9B that the optoelectronic semiconductor component respectively the coating 22 has been produced with a method described herein. Thus, the coating thickness 223 of the coating 22 on the side surfaces 2r1, 2r2 is approximately half the size of the coating thickness 224 on the coating surface 2a of the base layer 2. This leads to the conclusion that a normal angle φ of approximately 45° was used.

The invention is not limited to the exemplary embodiments by means of the description with regards to these exemplary embodiments. The invention rather comprises each new feature, as well as each combination of features, which particularly includes any combination of features in the patent claims, even if said feature or said combination of features is not explicitly indicated in the patent claims or exemplary embodiments per se.

The present application claims priority of German application DE 10 2014 108 348.2, the disclosure of which is incorporated herein by reference.

The invention claimed is:

1. A method for producing a coating comprising the steps:
providing a material source having a vaporization surface and a main coating direction,
providing a substrate holder having a top surface,
providing at least one base layer having a coating surface facing away from the substrate holder on the top surface of the substrate,
attaching the substrate holder to a rotating arm, which has a length along a main extension direction of the rotating arm,
adjusting the length of the rotating arm in such a manner that a normal angle, which is enclosed by the surface normal of the coating surface of the base layer through a sample point on the coating surface and a sample vector, derived from the connection vector from a point on the vaporization surface of the material source to the sample point on the coating surface, is at least 30° and at most 75° throughout the entire method,
applying at least one coating to that side of the base layer, which comprises the coating surface by means of the material source, wherein
during the coating process of the coating, the substrate holder is rotated around a substrate axis of rotation running along the main extension direction of the rotating arm.

2. The method according to claim 1 wherein
the substrate holder is additionally rotated around an overall axis of rotation, which runs along the main coating direction of the material source within the production tolerances,
the rotation around the substrate axis of rotation is effected with a first rotary frequency and the rotation around the overall axis of rotation is effected with a second rotary frequency, wherein the first rotary frequency is greater than the second rotary frequency,
at least two substrates are provided, and
the at least two substrates and the material source are not arranged on a common surface of a sphere.

3. The method according to claim 1, wherein the substrate holder is additionally rotated around an overall axis of rotation, which runs along the main coating direction of the material source within the production tolerances.

4. The method according to claim 3, wherein the rotation around the substrate axis of rotation is effected with a first rotary frequency and the rotation around the overall axis of rotation is effected with a second rotary frequency, wherein the first rotary frequency is greater than the second rotary frequency.

5. The method according to claim 1, wherein an arbitrary point on the coating surface is selected as the sample point on the coating surface.

6. The method according to claim 1, wherein a plurality of base layers with a plurality of coating surfaces is arranged on the top surface of the substrate holder.

7. The method according to claim 1, wherein the length of the rotating arm is at least 100 mm and at most 700 mm.

8. The method according to claim 1, wherein the length of the rotating arm is at least 200 mm and at most 400 mm.

9. The method according to claim 1, wherein the coating completely covers all edges and corners of the base layer facing away from the substrate holder.

10. The method according to claim 1, wherein the substrate holder has a disk-shaped design, wherein the radius of the circular surface area of the disk is at least 30 mm and at most 350 mm.

11. The method according to claim 1, wherein the substrate holder has an extension of at least 30 mm and at most 350 mm in at least one dimension.

12. The method according to claim 1, wherein at least two substrates are provided.

13. The method according to claim 12, wherein the at least two substrates and the material source are not arranged on a common surface of a sphere.

14. An optoelectronic semiconductor component, comprising:
- at least one base layer having
  - a coating surface,
  - two radial side surfaces opposite one another,
  - two tangential side surfaces opposite one another, which run transversely or perpendicularly to the radial side surfaces within the production tolerances,
  - a bottom surface and
  - edges and corners facing away from the bottom surface, and
- at least one coating, wherein
- the coating completely covers the edges and corners of the base layer.

15. The optoelectronic semiconductor component according to claim 14,
- wherein the coating has external surfaces, wherein the minimum distance of the external surfaces to at least one radial side surface of the base layer is at least 25% of the minimum distance of the external surfaces to the coating surface of the base layer.

16. The optoelectronic semiconductor component according to claim 14,
- wherein the coating has external surfaces, wherein the minimum distance of the external surfaces to at least one tangential surface of the base layer is at least 25% of the minimum distance of the external surfaces to the coating surface of the base layer.

17. The optoelectronic semiconductor component according to claim 14,
- wherein the coating in the region of the radial side surfaces and/or tangential side surfaces of the base layer is free of cracks penetrating entirely through the coating.

18. An optoelectronic semiconductor component, comprising:
- at least one base layer having
  - a coating surface,
  - two radial side surfaces opposite one another,
  - two tangential side surfaces opposite one another, which run transversely or perpendicularly to the radial side surfaces within the production tolerances,
  - a bottom surface and
  - edges and corners facing away from the bottom surface, and
- at least one coating, wherein
- the coating completely covers the edges and corners of the base layer and has external surfaces, wherein the minimum distance of the external surfaces to at least one radial side surface of the base layer is at least 25% of the minimum distance of the external surfaces to the coating surface of the base layer and/or
the minimum distance of the external surfaces to at least one tangential surface of the base layer is at least 25% of the minimum distance of the external surfaces to the coating surface of the base layer.

* * * * *